United States Patent [19]

Itoh

[11] Patent Number: 5,231,313
[45] Date of Patent: Jul. 27, 1993

[54] DELAY CIRCUIT
[75] Inventor: Sakae Itoh, Hyogo, Japan
[73] Assignee: Mitsubishi Denki Kabushiki Kaisha, Tokyo, Japan
[21] Appl. No.: 710,606
[22] Filed: Jun. 5, 1991
[30] Foreign Application Priority Data Jul. 10, 1990 [JP] Japan .................. 2-181862

[51] Int. Cl.$^5$ ............................. H03K 5/13
[52] U.S. Cl. ........................ 307/480; 307/590; 307/601
[58] Field of Search ............. 307/591, 600, 601, 605, 307/592, 590, 269, 480, 529; 328/72, 74; 377/47, 79

[56] References Cited

U.S. PATENT DOCUMENTS

| | | | |
|---|---|---|---|
| 3,753,126 | 8/1973 | Hines et al. | 307/262 |
| 4,400,666 | 8/1983 | Sekiguchi | 328/130.1 |
| 4,522,337 | 7/1985 | Toudo et al. | 307/269 |
| 4,646,331 | 2/1987 | Ely | 377/47 |
| 4,797,574 | 1/1989 | Okubo et al. | 307/480 |
| 4,940,904 | 7/1990 | Lin | 307/262 |
| 5,043,596 | 8/1991 | Masuda et al. | 307/262 |

FOREIGN PATENT DOCUMENTS 0175501  3/1986  European Pat. Off. .

Primary Examiner—Jin F. Ng
Assistant Examiner—Sinh Tran
Attorney, Agent, or Firm—Townsend and Townsend, Khourie and Crew

[57] ABSTRACT

A delay clock signal is generated by delaying an input clock signal by a predetermined time interval with a delay circuit, and is subjected to frequency division with a frequency divider circuit to generate a reference clock signal. This delay clock signal and the input clock signal are provided to a flip-flop to generate a first electronic state signal when the input clock signal turns from "High" to "Low", and a second electronic state signal when the reference clock signal turns from "High" to "Low", and to electronically activate a control object during the time the second electronic state signal is inputted.

13 Claims, 4 Drawing Sheets

DELAY CIRCUIT

BACKGROUND OF THE INVENTION

1. Field of the Invention

The present invention relates to a delay circuit, and more specifically to a delay circuit for delaying a predetermined time with respect to a reference clock signal a control signal to be sent to a control object (a tri-state buffer etc., to set the timing of a signal fed from an IC to the outside so as to satisfy predetermined conditions, for example).

2. Description of the Prior Art

Referring to FIGS. 4A and 4B, there are illustrated a circuit diagram of a prior delay circuit of the type described above and a control target of the same, respectively. In FIG. 4A, numeral 1 indicates a delay section composed of a plurality of inverters $1a$ through $1d$ connected in series to each other, from which an input signal B as a reference clock signal is outputted as a signal Bd, delayed a predetermined time interval. Numeral 2 indicates a NAND gate which receives the signal B as one input and the signal Bd as the other input, and outputs a NAND signal between both signals as a signal C. Additionally, in FIG. 4B numeral 3 indicates a tri-state buffer which receives X as an input signal and the foregoing signal C as a control input, and which outputs Y as an output signal.

Referring to FIG. 5, a operation timing chart of FIG. 4 is illustrated. Herein, the reference clock signal B, which is not illustrated, is generated by halving the frequency of a clock signal A, the frequency being twice that of the reference clock signal B.

In the following, there will be described the prior delay circuit shown in FIG. 4. The delay circuit is to output the input signal X as a signal Y with the assumption that the control signal C to the tri-state buffer 3 is valid from the time $t_2$ a predetermined time interval $\Delta t$ after the leading edge of the reference clock signal B to the trailing edge of the same signal B.

The operation will be described further in detail on the basis of the timing chart of FIG. 5. Once the reference clock signal B changes from 'L' to 'H' at the time $t_1$, the change is delayed by the delay section composed of the plurality of the inverters $1a$ through $1d$ of FIG. 4, and the signal Bd changes from 'L' to 'H' a certain time after the time $t_1$. Hereby, the two inputs B, Bd of the NAND gate 2 change together to 'H', and output C of the same changes from 'H' to 'L'. It is assumed that the time the signal C changes from 'H' at the time $t_1$ to 'L' is $\Delta t_a$. This is substantially determined by the delay time in the delay section 1. As the control signal C changes to 'L', or becomes valid, the tri-state buffer 3 of FIG. 4B is switched on to permit the input signal X to be outputted at the time $t_2$ as the signal Y. It is assumed as $\Delta t_b$ a time interval from the time the control signal C becomes 'L' to the time the signal Y is settled to 'H' or 'L'. Successively, as the clock signal B changes from 'H' to 'L' at the time $t_3$, the output C of the NAND gate 2 immediately changes from 'L' to 'H' to cause the tri-state buffer 3 to be off with its output being high impedance. It is assumed a time interval from the time $t_3$ to the time the output of the tri-state buffer 3 changes to high impedance is $\Delta t_c$. The interval $\Delta t_c$ is relatively shorter than $\Delta t_b$.

The prior delay circuit constructed as described above however has the following problems.

Generally, switching speeds of transistors as basic elements of various circuits are changed according to variations of power supplies and of temperature, and particularly affected by variations of supply voltages. Such a switching speed is faster as the supply voltage is higher, and oppositely it is instead slower as the same voltage is lower. Accordingly, the time interval $\Delta t_a$ from the building-up of the reference clock signal B to the time the control signal C is 'L' (valid) or the time interval $\Delta t_b$ from the time the control signal C is 'L' to the time the tri-state buffer 3 of FIG. 4(B) is switched on to establish the signal Y is shorter as the supply voltage is higher or vice versa. There is accordingly produced a problem that the time interval $\Delta t$ from the time $t_1$ of the building-up of the reference clock signal B to the time $t_2$ of the establishment of the signal Y is severel varied as the supply voltage is higher and lower. Herein, $\Delta t_c$ shown in FIG. 5 does not have such a problem although it is also changed as the supply voltage becomes higher and lower, because it is inherently small in itself.

In view of the drawbacks with the prior art, it is an object of the present invention to provide a delay circuit capable of reducing to the utmost the width of variations of delay time as a target of control where the delay time might be shifted from a set value owing to supply voltage and the like becoming higher and lower.

SUMMARY OF THE INVENTION

In the prior circuit, the reference clock signal B is available from the clock signal A halved in frequency, the clock signal A having a frequency twice that of the reference clock signal B. In the present invention, there are provided, as illustrated in FIG. 1, delay means 4 and frequency-divider means 8 for generating the reference clock signal B by rendering the input clock signal A to predetermined delay and frequency division, and control signal generator means 10 for generating the control signal C which becomes valid since a predetermined changing point of the input clock singal A during the time the reference clock signal B is valid, the control signal being to control the control target 3.

In accordance with the present invention, the provision of the means described above assures that when the supply voltage is high for example, there is shortened the time until the signal Y is established taking the input clock signal A as a reference whilst there is also shortened the time from the input clock signal A to the building-up of the reference clock signal B. Therefore, there is not severely changed a relative time from the reference clock signal B to the establishment of the signal Y.

The above and other objects, features, and advantages of the invention will become more apparent from the following description when taken in conjunction with the accompanying drawings.

DESCRIPTION OF THE PREFERRED EMBODIMENT

In what follows, an embodiment of the present invention will be described.

Figure 2A:
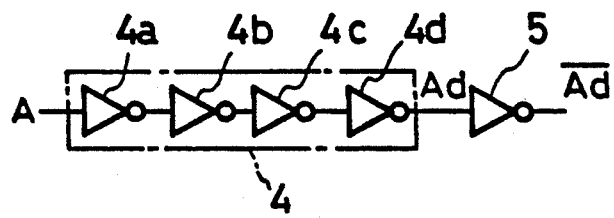
FIG. 2 is a circuit diagram illustrating an embodiment of the present invention.
Figure 2B:
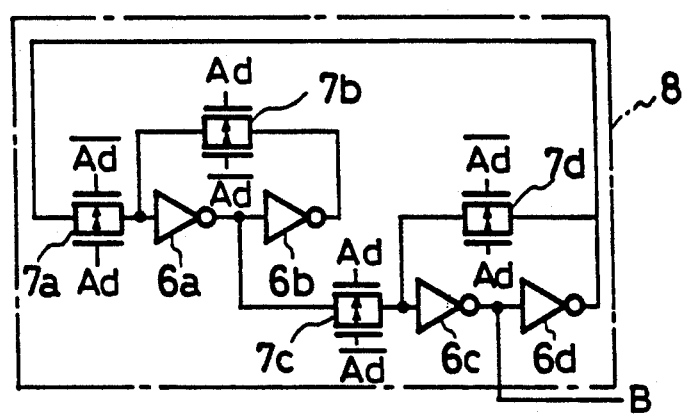
Figure 2C:
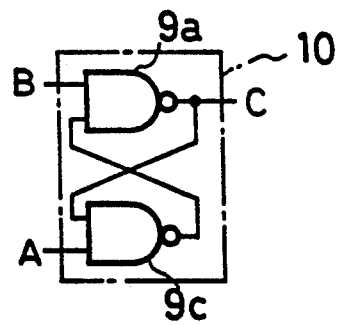
Figure 2D:
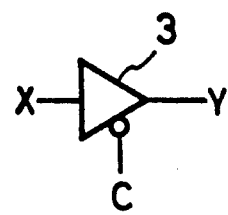

FIGS. 2A, 2B, and 2C are circuit diagrams illustrating an embodiment of a delay circuit according to the present invention, and FIG. 2D is a view illustrating a control target of the foregoing embodiment. Herein, the foregoing circuits are placed on the same IC chip and the same substrate and driven by a common power supply. In FIG. 2A, A denotes an input clock signal as a clock source which is generated by an oscillator, 4 denotes a delay section formed of a plurality of inverters 4a through 4d connected in series for issuing a signal Ad yielded by delaying a predetermined time interval the input clock signal A, and 5 denotes an inverter for forming an inverted signal $\overline{Ad}$ of the signal Ad. On the other hand, in FIG. 2B, 6a through 6d denote inverters, and 7a through 7d denote two-way gates each controlled by the clock signals Ad and $\overline{Ad}$, with which components a frequency-divider circuits 8 is constituted for generating a reference clock signal B yielded by halving the clock signal Ad in frequency. Further, in FIG. 2C, 9a, 9b denote NAND gates which constitute a flip-flop 10 which is set by the trailing edge of the reference clock signal B and reset by the trailing edge of the clock signal A. The flip-flop 10 corresponds to the control signal generator means of the present application, an output signal C of which is inputted into a control input of a tri-state buffer 3 illustrated in FIG. 2D which inputs thereinto a signal X and outputs a signal Y.

Figure 3:
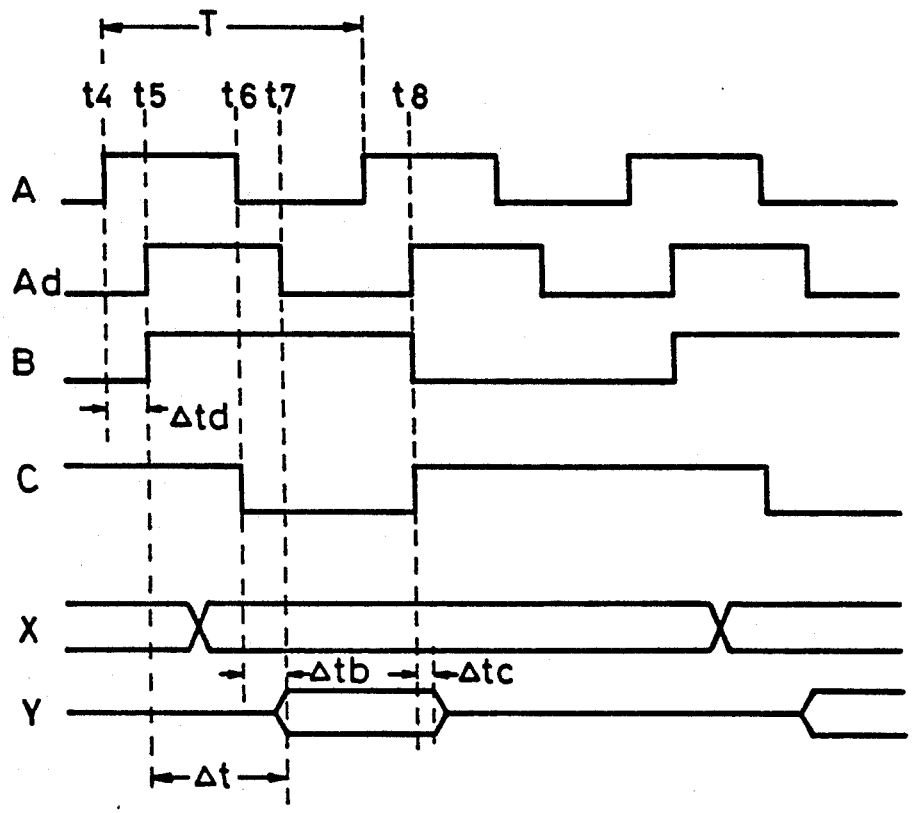
FIG. 3 is a timing chart illustrating the operation of the foregoing embodiment.
Figure 4A:
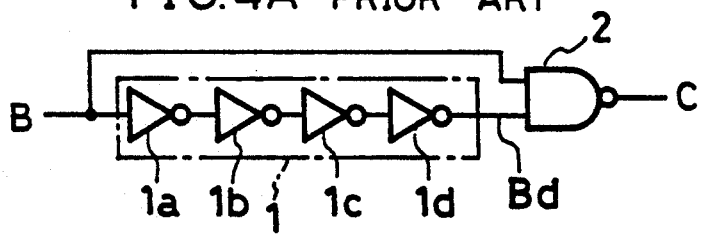
FIG. 4 is a prior circuit diagram.
Figure 4B:
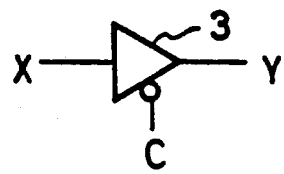
Figure 5:
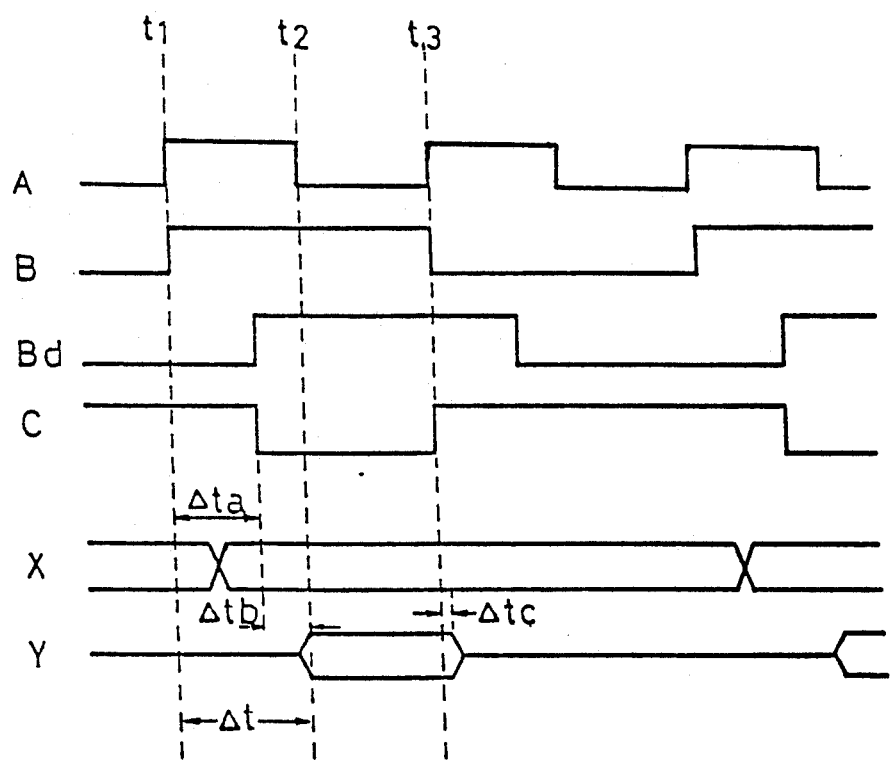
FIG. 5 is a timing chart illustrating the operation of the prior example.

Operation of the embodiment described above is as follows. Referring to FIG. 3, an operation timing chart is illustrated.

Assumed the input clock signal A to be a clock signal illustrated in FIG. 3, the delay section 4 composed of the inverters 4a through 4d outputs an output Ad as a clock signal, i.e., the signal A but delayed a given time interval. Once the clock signal Ad is halved in frequency by the frequency-divider circuit 8 of FIG. 2B, it yields the reference clock signal B of FIG. 3. Herein, a time interval from the building-up time $t_4$ of the clock signal A to the building-up time $t_5$ of the clock signal B is assumed to be $\Delta t_d$ which is substantially determined by the delay section 4 composed of the inverters. Once the clock singal A builds up at the time $t_6$, the flip-flop 10 of FIG. 2C is reset to cause the control signal C to be 'L', i.e., valid. As the control signal C becomes 'L', the tri-state buffer 3 in FIG. 2D is made on to permit the input signal X to be outputted at the time $t_7$ as a signal Y. A time interval from the time the control signal C becomes 'L' to the time the signal Y is settled to 'H' or 'L' is expressed by $\Delta t_b$. As the reference clock signal B changes from 'H' to 'L' at the time $t_8$, the flip-flop 10 is set to permit the signal C to change from 'L' to 'H', whereby the tri-state buffer 3 is made off and the output of the same becomes high impedance. A time interval from the time $t_a$ to the time the output of the tri-state buffer 3 becomes high impedance is indicated as $\Delta t_c$.

Accordingly, a time interval $\Delta t$ from the building-up of the reference clock signal B to the time the singal Y is settled is given by $$\Delta t = T/2 - \Delta t_d + \Delta t_b \quad (1)$$

where T is the period of the clock signal A. Accordingly, $\Delta t_d$ and $\Delta t_b$ may be set such that $\Delta t$ is a desired value. Herein, although $\Delta t_d$ and $\Delta t_b$ are both reduced as the power supply voltage is increased or reversely they are both increased as the same votlage is reduced, $\Delta t_d$ and $\Delta t_b$ are opposite in their signs to each other as understood from the equation (1) and hence cancelled out each other. Thus, only a difference between $\Delta t_d$ and $\Delta t_b$ contributes to a change in $\Delta t$ produced as a result of variations of the power supply voltage, permitting the range of the change in $\Delta t$ to be sharply reduced compared with the prior art. Herein, since $\Delta t_b$ is the operation delay of the control object such as the tri-state buffer 3 and the like, $\Delta t_b$ is first determined in response to the control object. Accordingly, $\Delta t_d$, i.e., the number of stages of the invertes constituting the delay section 4 in the present embodiment may be determined with consideration of $\Delta t_b$ such that $\Delta t$ becomes a desired value. But, as evidenced from the foregoing equation (1), $\Delta t_d$ should be reduced if $\Delta t$ is desired to be increased while $\Delta t_d$ should be increased if $\Delta t$ is desired to be reduced.

Figure 1:
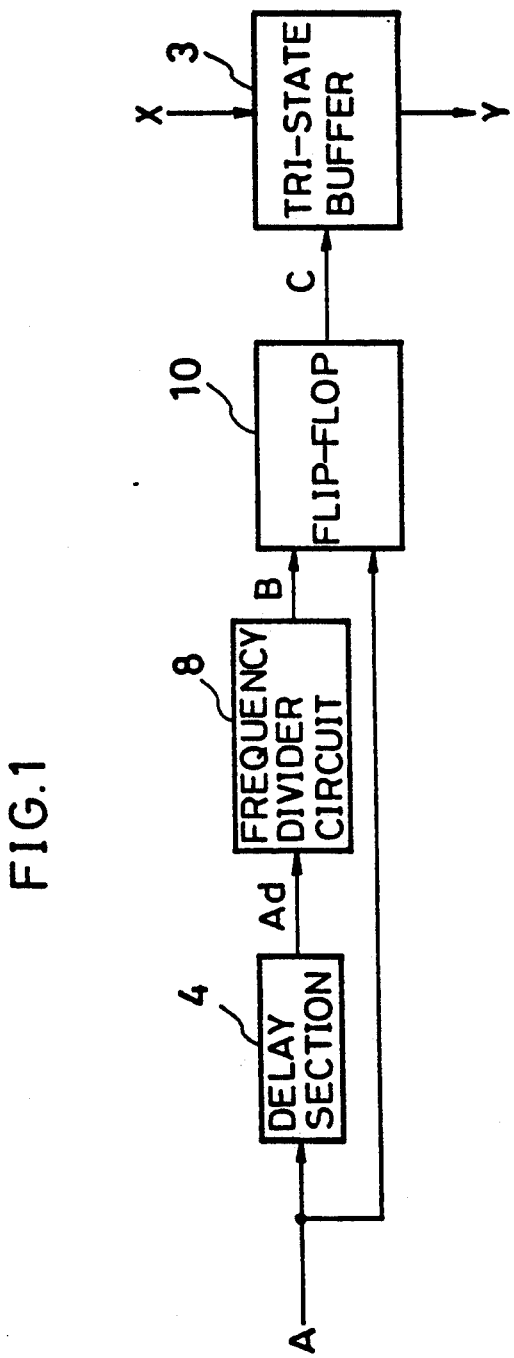
FIG. 1 is a block diagram illustrating the construction of the present invention.

Although in the above embodiment the input clock signal A was first delayed and then frequency is divided to provide the reference clock signal B, the same effect is attained also in the case where the order of the delay means (delay section) 4 and the frequency-divider means (frequency-divider circuit) 8 of FIGS. 1 and 2 are reversed.

Additionally, although in the above embodiment the delay means was constructed with a plurality of the idnverters in series connection and the frequency-divider means with the frequency divider circuit composed of the inverter and the two-way gate, and further the control signal generator means with the flip-flop composed of the NAND gate, and the tri-state buffer was controlled as the control object, the present invention is not limited thereto, permitting varieties of known circuits to be used.

According to the present invention, as described above, the clock signal as the reference and the operation of the control object delayed from the former are both shifted owing to a change in the power supply voltage but a relative relation therebetween is not varied so much. Therefore, a delay circuit is achieved in which the delay time of the control object can stably be set even with a change in the power supply voltage and the like.

What is claimed is:

1. A delay circuit for delaying a control signal to be supplied to a control object by a predetermined time interval with respect to a reference clock signal, said delay circuit comprising:

(a) delay and frequency-divider means for generating the reference clock signal by subjecting an input clock signal to predetermined time delay and frequency division; and (b) control signal generator means, coupled to said delay and frequency-divider means and having two inputs, one for receipt of said input clock signal and the other for receipt of said reference clock signal, for asserting the control signal after a predetermined changing point of the input clock signal while the reference clock signal has a particular amplitude level.

2. A delay circuit according to claim 1 wherein a delay portion of said delay and frequency-divider means comprises a plurality of inverters connected in series with each other.

3. A delay circuit according to claim 1 wherein a frequency-dividing portion of said delay and frequency-divider means comprises a frequency-divider circuit composed of inverters and two-way gates.

4. A delay circuit according to claim 1 wherein said control signal generator means comprises NAND gate flip-flops.

5. A delay circuit according to claim 1 wherein the control object is a tri-state buffer.

6. A delay circuit comprising:
   means, having an input for receipt of an input clock signal, said input clock signal including first and second voltage levels, for:
   delaying said input clock signal a predetermined amount; and
   frequency dividing said input clock signal to produce a reference clock signal at an output, said reference clock including first and second voltage levels; and
   means, coupled to said input and to said output, for asserting a control signal to a control object when said voltage levels of said input clock signal and said voltage levels of said reference clock signal have a predefined relationship to each other.

7. The delay circuit of claim 6 wherein said predefined relationship includes the input clock signal transitioning to a first voltage level when said reference clock signal has a second voltage level.

8. A delay circuit for asserting a control signal, comprising:
   an input for receipt of an input clock signal having first and second voltage levels;
   a frequency-scaling and delaying circuit, coupled to said input, for producing a reference clock signal from said input clock signal, said reference clock signal having first and second voltage levels; and
   a flip-flop, coupled to said input and to said frequency-scaling and delaying circuit, for asserting a control signal to a control object when said reference clock signal is asserted concurrent with a deassertion of said input clock signal.

9. A method for asserting a control signal, comprising the steps of:
   receiving an input clock signal having a plurality of voltage levels;
   frequency-scaling and delaying said input clock signal to produce a reference clock signal having a plurality of voltage levels; and
   asserting a control signal responsive to a predetermined relationship between said voltage levels of said input clock signal and said voltage levels of said reference clock signal.

10. A delay circuit, comprising:
    delay means for generating a delay clock signal by delaying an input clock signal by a predetermined time interval;
    frequency divider means, coupled to said delay means, for generating a reference clock signal by frequency dividing said delay clock signal;
    control signal generator means, coupled to said frequency divider means, for generating a first electronic state signal when said input clock signal undergoes a first particular transition, and for generating a second electronic state signal when said reference clock signal undergoes a second particular transition; and
    a control object, coupled to said control signal generator means, that is activated responsive to said second electronic state signal.

11. A delay circuit, comprising:
    a delay circuit for generating a delay clock signal by delaying an input clock signal by a predetermined time interval;
    a frequency divider circuit, coupled to said delay circuit, for generating a reference clock signal by frequency dividing said delay clock signal;
    a flip-flop, coupled to said frequency divider circuit, for generating a first electronic state signal when said input clock signal undergoes a first particular transition, and for generating a second electronic state signal when said reference clock signal undergoes a second particular transition; and
    a tri-state buffer, coupled to an output of said flip-flop, that is activated responsive to said second electronic state signal and deactivated responsive to said first electronic state signal.

12. A delay circuit for delaying a control signal to be supplied to a control object by a predetermined time interval with respect to a reference clock signal, said delay circuit comprising:
    (a) delay and frequency-divider means for delaying an input clock signal to provide a delayed clock signal and for frequency-dividing said delayed clock signal to produce the reference clock signal; and
    (b) control signal generator means, coupled to said delay and frequency-divider means and consisting essentially of a first and a second two-input NAND gate wherein a first input of said first NAND gate receives said input clock signal, said second input of said first NAND gate is coupled to an output of said second NAND gate, a first input of said second NAND gate receives said reference signal and a second input of said second NAND gate is coupled to an output of said first NAND gate, said output of said second NAND gate asserting the control signal to a control object after a predetermined transition point of the input clock signal while the reference clock signal is asserted.

13. A circuit for controlling a signal provided to a control object, comprising:
    a delay section for receipt of an input clock signal to produce a delayed clock signal;
    a frequency divider circuit, coupled to said delay section, to frequency divide said delayed clock signal to provide a reference clock signal; and
    a bistable multivibrator, coupled to said frequency-divider circuit, and receiving the input clock signal for asserting the signal to the control object when a voltage level of said input clock signal and a voltage level of said reference clock signal have a predetermined relationship.

* * * * *